United States Patent
Nagano

(10) Patent No.: US 11,569,061 B2
(45) Date of Patent: Jan. 31, 2023

(54) MULTIBEAM SCANNING APPARATUS AND MULTIBEAM SCANNING METHOD

(71) Applicant: Kioxia Corporation, Tokyo (JP)

(72) Inventor: Osamu Nagano, Nagoya (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/305,877

(22) Filed: Jul. 16, 2021

(65) Prior Publication Data

US 2022/0301814 A1  Sep. 22, 2022

(30) Foreign Application Priority Data

Mar. 18, 2021 (JP) ............... JP2021-045245

(51) Int. Cl.
*H01J 37/28* (2006.01)
*H01J 37/26* (2006.01)

(52) U.S. Cl.
CPC ............ *H01J 37/28* (2013.01); *H01J 37/265* (2013.01); *H01J 2237/2806* (2013.01); *H01J 2237/30405* (2013.01)

(58) Field of Classification Search
CPC .. H01J 37/00; H01J 37/02; H01J 37/26; H01J 37/28; H01J 37/265; H01J 37/1472; H01J 37/1474; H01J 2237/2806; H01J 2237/30405
USPC .......................................... 250/306, 307, 311
See application file for complete search history.

(56) References Cited

U.S. PATENT DOCUMENTS

| | | | |
|---|---|---|---|
| 9,263,233 B2 | 2/2016 | Zeidler et al. | |
| 10,041,892 B2 | 8/2018 | Shiratsuchi et al. | |
| 10,775,326 B2 | 9/2020 | Tsuchiya et al. | |
| 10,825,648 B2 | 11/2020 | Hendriksen et al. | |
| 2014/0231668 A1* | 8/2014 | Yasuda | H01J 37/3026 250/396 R |
| 2019/0360951 A1* | 11/2019 | Ogawa | G01N 23/04 |
| 2020/0211814 A1* | 7/2020 | Van Der Toorn | H01J 37/28 |
| 2021/0005422 A1* | 1/2021 | Nakashima | H01J 37/222 |

FOREIGN PATENT DOCUMENTS

| | | |
|---|---|---|
| JP | 2013-128069 A | 6/2013 |
| JP | 2019-153536 A | 9/2019 |
| JP | 6684179 B2 | 4/2020 |

* cited by examiner

*Primary Examiner* — Jason L McCormack
(74) *Attorney, Agent, or Firm* — Oblon, McClelland, Maier & Neustadt, L.LP.

(57) ABSTRACT

A multibeam scanning apparatus of an embodiment is a multibeam scanning apparatus configured to emit a plurality of electron beams to a plurality of scan regions set in a matrix on an object and obtain an observation image by detecting secondary beams, the apparatus including a control circuit. Each of the scan regions includes a plurality of separated scan regions obtained by separating the each of the scan regions in a direction orthogonal to a scanning direction of the electron beams. The control circuit controls the irradiation positions of the electron beams, in two of the scan regions adjacent to each other in the scanning direction of the electron beams, such that the separated scan regions to be scanned at a same time are displaced from each other by a predetermined distance in the direction orthogonal to the scanning direction of the electron beams.

14 Claims, 13 Drawing Sheets

(MOVING DIRECTION OF SAMPLE STAGE 31)

SCAN TIME: T

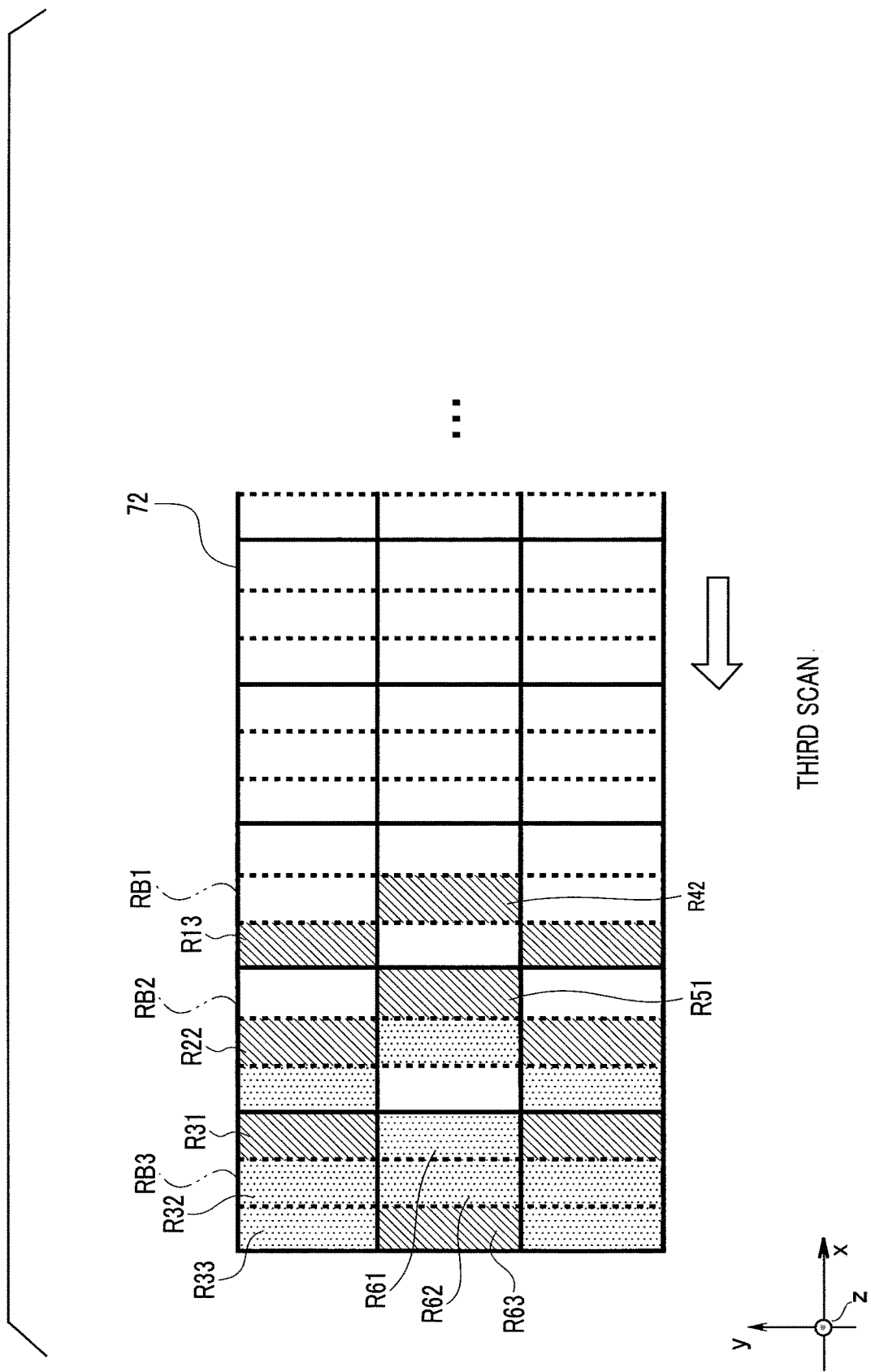

MULTIBEAM SCANNING APPARATUS AND MULTIBEAM SCANNING METHOD

CROSS-REFERENCE TO RELATED APPLICATIONS

This application is based upon and claims the benefit of priority from the prior Japanese Patent Application No. 2021-045245 filed on Mar. 18, 2021; the entire contents of which are incorporated herein by reference.

FIELD

An embodiment described herein relates generally to a multibeam scanning apparatus and a multibeam scanning method.

BACKGROUND

Multibeam scanning electron microscopes (hereinafter also referred to as SEMs) have recently received attention. A multibeam scanning SEM quickly acquires an SEM image of an observation object with a wide area by simultaneous scanning of multiple electron beams unlike a single-beam scanning electron microscope apparatus configured to acquire an image by scanning a pattern with a single electron beam (single beam) on a surface of a silicon wafer or the like to be observed.

BRIEF DESCRIPTION OF THE DRAWINGS

FIG. 15 is an explanatory diagram of another scanning method when each scan region is divided into three.

DETAILED DESCRIPTION

A multibeam scanning apparatus according to the present embodiment is configured to emit a plurality of electron beams to a plurality of scan regions set in a matrix on an object and obtain an observation image by detecting secondary beams generated from the scan regions. The multibeam scanning apparatus according to the present embodiment includes a control unit configured to separately control irradiation positions of the plurality of electron beams. Each of the scan regions includes a plurality of separated scan regions obtained by separating the each of the scan regions in a second direction orthogonal to a first direction serving as a scanning direction of the electron beams. The control unit controls the irradiation positions of the electron beams, in two of the scan regions adjacent to each other in the first direction, such that the separated scan regions to be scanned at a same time are displaced from each other by a predetermined distance in the second direction.

An embodiment will be described below with reference to the accompanying drawings.

Figure 1:
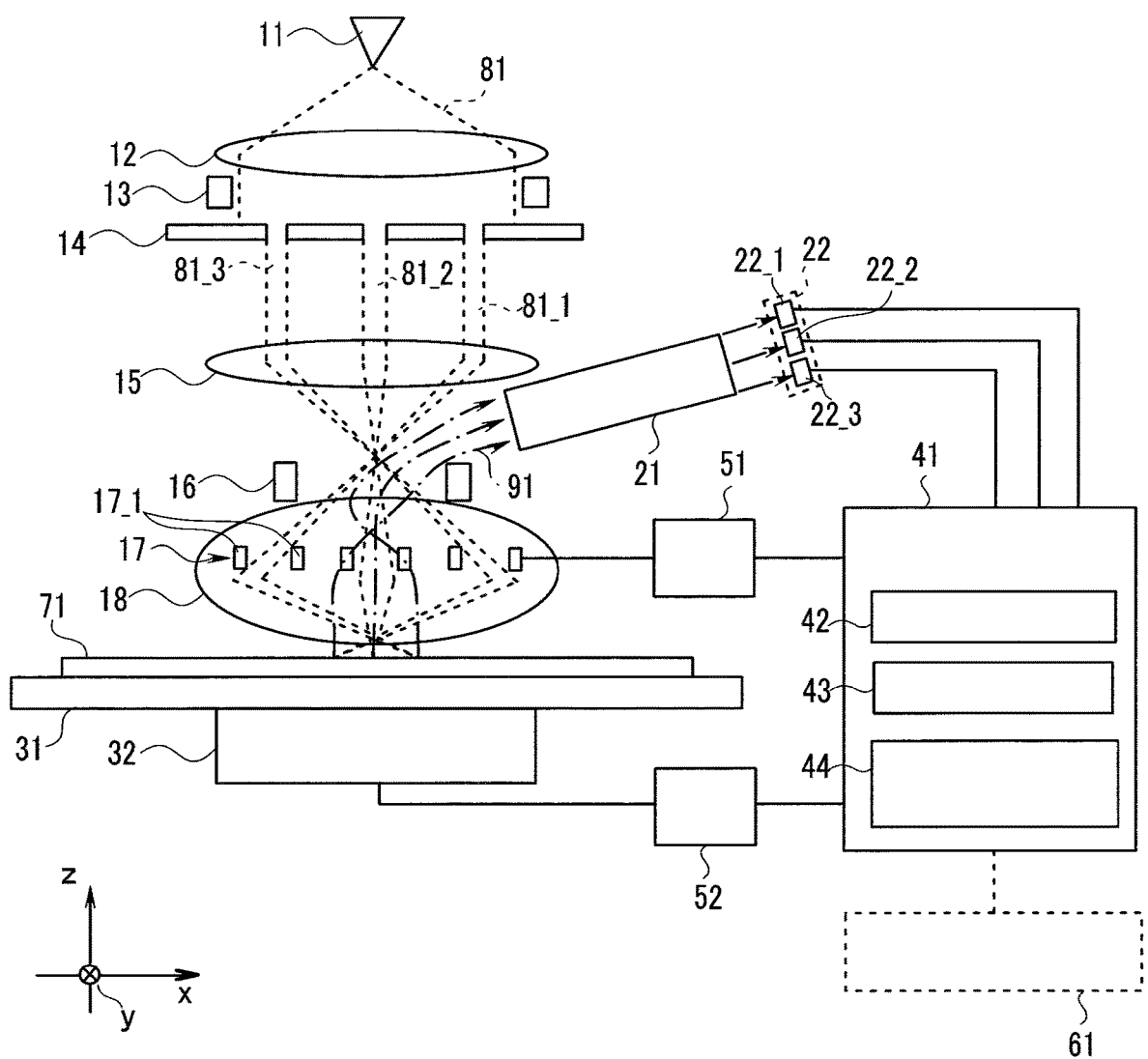
FIG. 1 is a block diagram illustrating a configuration example of a multibeam scanning apparatus according to an embodiment.

FIG. 1 is a block diagram illustrating a configuration example of the multibeam scanning apparatus according to the present embodiment. The multibeam scanning apparatus according to the present embodiment is used for emitting an electron beam, which is called a primary beam, to a semiconductor device illustrated as an object 71 (for example, a silicon wafer with patterns including a memory cell array of an NAND memory having a three-dimensional structure) and observing a pattern or a structure formed on a surface of the object 71 from a signal of generated secondary electrons, reflected electrons, and the like (hereinafter referred to as a secondary beam). For example, the multibeam scanning apparatus is used as a measuring apparatus configured to measure a shape or dimensions or an inspection apparatus configured to inspect a forming state of a pattern. The multibeam scanning apparatus is also used as an inspection apparatus configured to detect an electrical result of a circuit pattern of a semiconductor device as well as the inside of the pattern (lower layer) by obtaining a VC (voltage contrast) image.

The multibeam scanning apparatus according to the present embodiment includes an irradiation unit configured to irradiate the object 71 with the primary beam, a detection unit configured to detect the secondary beam generated from the object 71, a stage unit on which the object 71 is loaded, and a control unit configured to control the overall apparatus. In FIG. 1, dotted lines indicate primary beams 81 and dash-dot lines indicate secondary beams 91.

The irradiation unit mainly includes an electron gun 11, a first condenser lens 12, deflectors 13 and 17, an aperture array 14, a second condenser lens 15, a Wien filter 16, and an objective lens 18. The electron gun 11 generates an electron beam (primary beam 81) from an electron source and accelerates the electron beam toward the object 71. The primary beam 81 emitted from the electron gun 11 is deflected into a parallel beam through the first condenser lens 12 and the deflector 13. The primary beam 81 deflected into the parallel beam is divided by the aperture array 14.

Figure 2:
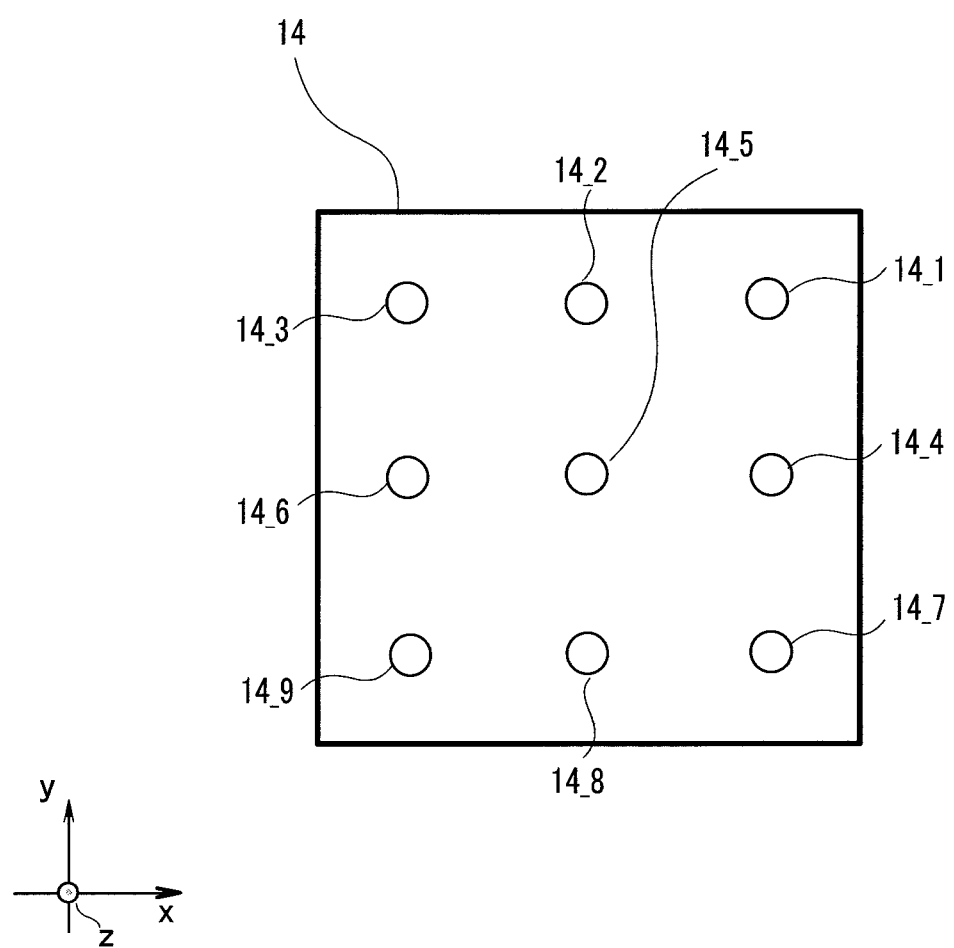
FIG. 2 is an explanatory diagram of an example of an aperture array.

FIG. 2 is an explanatory diagram of an example of the aperture array 14. As illustrated in FIG. 2, the aperture array 14 is a substrate having a plurality of openings in a two-dimensional array. In the present embodiment, the aperture array 14 has nine openings 14_1 to 14_9 that divide the primary beam 81 into nine beams. The number of openings formed on the aperture array 14 is not limited to nine. The number of openings may be nine or more, for example, 25 or 100, or eight or less. The openings 14_1 to 14_9 are disposed in a 3 by 3 matrix. FIG. 1 illustrates three of the nine separated primary beams 81. In a following description, the primary beam 81 emitted from openings 14_m (m=1, 2, . . . 9) may be denoted as the primary beams 81_m, each of the secondary beams 91 generated for the primary beams 81_m may be denoted as the secondary beam 91_m, and other constituent elements provided for the respective primary beams 81_m may be denoted like the beams.

The primary beams 81_m separated by the aperture array 14 are each condensed through the second condenser lens 15. The Wien filter 16 is provided around the image-forming position of the primary beams 81_m. The Wien filter 16 generates a magnetic field and an electric field that are orthogonal to each other in a plane substantially normal to a central axis, thereby forming an angle of deflection with respect to passing electrons according to energy of the electrons. In the present embodiment, the strengths of the magnetic field and the electric field are set such that the primary beams 81_m travel in straight lines and the incoming secondary beams 91 from the opposite side (the lower side in z direction) are deflected at a desired angle so as to reach a detection section 22.

The primary beams 81_m having passed through the Wien filter 16 are reduced and projected to a predetermined region of the object 71 by the objective lens 18 and the deflector 17. The deflector 17 for scanning deflection is, for example, an electrostatic deflector having four or eight electrodes. The deflector 17 is placed in the objective lens 18. The deflector 17 is provided for each of the separated primary beams 81_m. In the embodiment, the objective lens 18 contains nine deflectors 17_m. The primary beams 81_m are deflected at a predetermined angle in a predetermined direction according to deflected electric fields formed in the respective deflectors 17_m, and then the primary beams 81_m scan the object 71. Note that the deflected electric fields in the respective deflectors 17_m are formed according to a scanning signal inputted from a scanning-signal control circuit 51.

The detection unit mainly includes the objective lens 18, the Wien filter 16, a projection optical system 21, and the detection section 22. The secondary beams 91_m generated from the object 71 by irradiation of the primary beams 81_m are caused to converge through the objective lens 18, are deflected to a desired angle by the Wien filter 16, and then are projected to a projection plane of the detection section 22 by the projection optical system 21. The projection plane is not illustrated. The detection section 22 includes a plurality of detectors 22_m for the respective secondary beams 91_m generated from the object 71. In the foregoing example, the detection section 22 includes nine detectors 22_1 to 22_9 provided for nine secondary beams 91_1 to 91_9, respectively. The detectors 22_m receive the secondary beams 91_m generated from the object 71 and generate signals according to the intensity of the received secondary beams 91_m. The detection section 22 includes, for example, a plurality of semiconductor sensing devices (solid-state image sensing devices) disposed in a two-dimensional array. The semiconductor sensing device is, for example, a PIN photodiode. The secondary beams 91_m generated by the primary beams 81_m in an irradiation region of the object 71 are converted into signals by the semiconductor sensing elements disposed in projection regions of the detectors 22_m and then are outputted as image pickup signals.

The stage unit mainly includes a sample stage 31 and a stage drive unit 32. The sample stage 31 can be moved in two directions (x direction, y direction), which extend straight in parallel with a surface of the sample stage 31, by the stage drive unit 32, e.g., a motor. The movement of the sample stage 31 in x direction and/or y direction can move the irradiation regions of the primary beams 81_m on the object 71. The operations of the stage drive unit 32 are controlled by a stage control circuit 52.

The control unit controls the operations of the overall multibeam scanning apparatus according to a set scanning method. Moreover, an obtained observation result of the object 71 as a result of scan is stored. The control unit mainly includes a controller 41, the scanning-signal control circuit 51, and the stage control circuit 52. The controller 41 is, for example, a computer including a central processing unit (CPU) 42, a RAM 43, and a memory 44. The CPU 42 operates according to a program stored in the memory 44 and controls the units of the controller 41. The RAM 43 stores data inputted from the detection section 22 and stores a result of an operation that will be described later.

The memory 44 stores observation software for obtaining a desired observation image by operating the irradiation unit and the stage unit. The observation software is not illustrated. The observation software is read and loaded by the RAM 43 and is executed by the CPU 42, thereby observing a pattern and a structure that are formed on the surface of the object 71. The controller 41 may be configured such that the operation implemented by the observation software is performed by at least one processor that is configured as hardware. The processor is not illustrated. The processor configured to perform the operation implemented by the observation software is, for example, a processor configured as an electronic circuit or a processor configured as an integrated circuit including an FPGA (field programmable gate array). The memory 44 stores an observation image generated based on the image pickup signal outputted from the detection section 22. An image processing unit configured to generate the observation image from the image pickup signal is not illustrated. The multibeam scanning apparatus according to the embodiment may include a display 61 configured to display the observation image.

Figure 3:
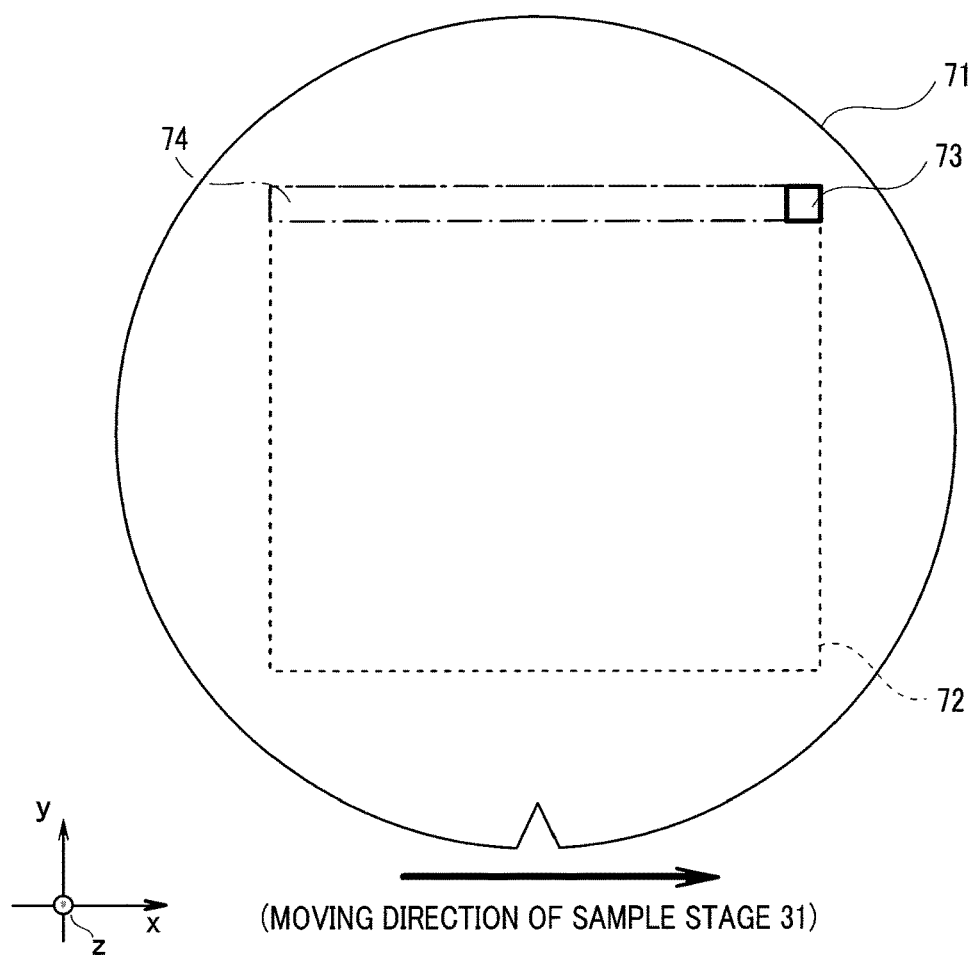
FIG. 3 is an explanatory diagram of an observation region on an object.
Figure 4:
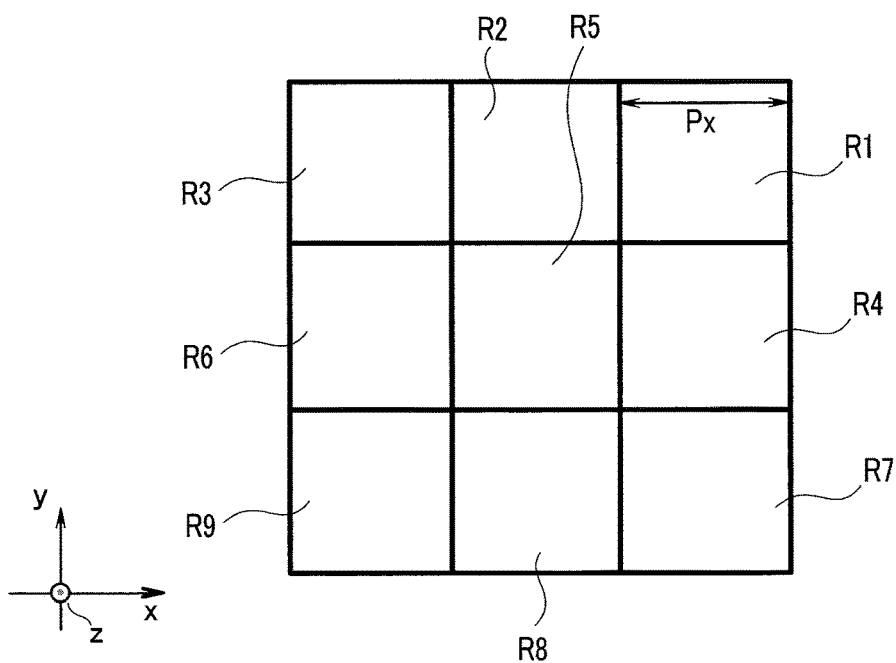
FIG. 4 is an explanatory diagram of scan regions of primary beams.

A scanning method of the object 71 according to the embodiment will be described below. FIG. 3 is an explanatory diagram of an observation region on the object. FIG. 4 is an explanatory diagram of scan regions of the primary beams. When the object 71 is observed, first, an observation region 72 is set on the surface of the object 71. As illustrated in FIG. 3, for example, a rectangular region including a center of the object 71 is set as the observation region 72. The observation region 72 is fully scanned by the primary beam 81, so that an observation image is obtained. In the observation region 72, an irradiation region 73 of the primary beam is set. For example, the irradiation region 73 is a range that can be scanned by the primary beams 81_m emitted from the electron gun 11 and separated only by controlling a scan angle through the deflectors 17 without moving the sample stage 31.

As illustrated in FIG. 4, the irradiation region 73 is divided into scan regions R1 to R9 according the number of separated primary beams 81. The scan regions R1 to R9 are disposed in the same pattern as the openings 14_1 to 14_9 provided in the aperture array 14. For example, when the openings 14_1 to 14_9 are disposed in a 3 by 3 matrix as illustrated in FIG. 2, the irradiation region 73 is divided into the scan regions R1 to R9 in a 3 by 3 matrix.

Figure 5:
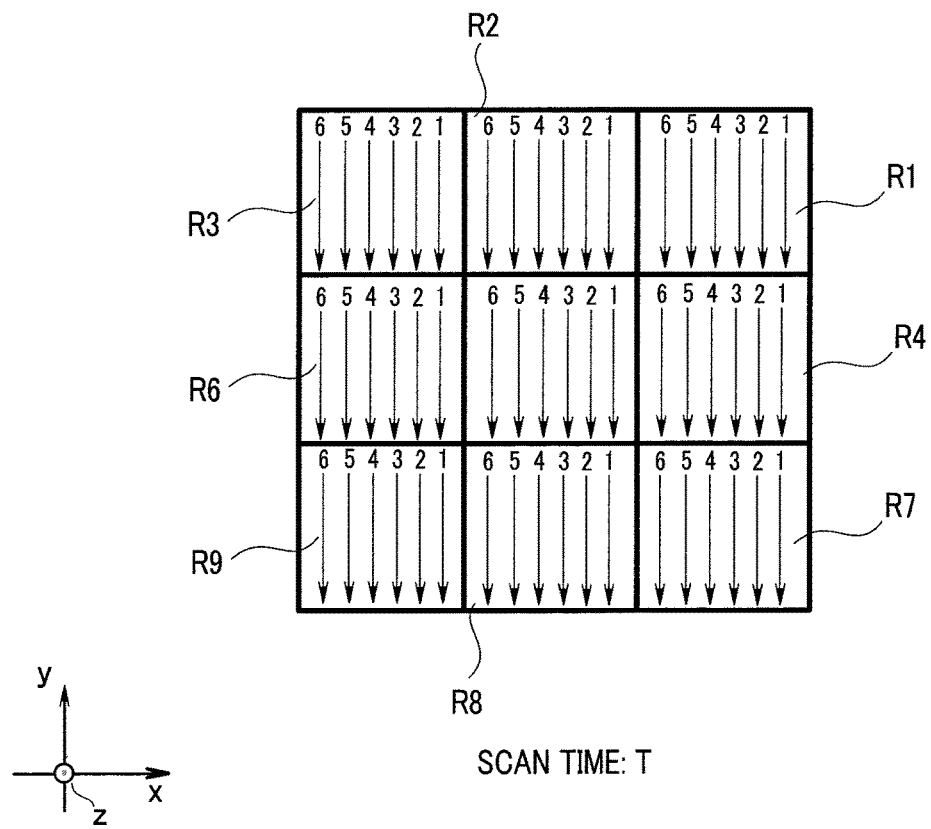
FIG. 5 is an explanatory diagram of a scanning method of the primary beams according to a comparative example.

For a description of the scanning method according to the embodiment, a scanning method according to a comparative example will be described below. FIG. 5 is an explanatory diagram of a scanning method of the primary beams according to the comparative example. The scan regions R1 to R9 are scanned by the respective primary beams 81_1 to 81_9. In FIG. 5, a plurality of thin arrow lines in respective scan regions Rm schematically indicate scan lines of the primary beams $81\_m$. Arrows of the thin arrow lines indicate scanning directions of the respective scan lines. Numbers at root portions of the thin arrow lines indicate an order of scanning in the scan regions Rm. In other words, the primary beams $81\_m$ perform line scans in the allocated scan regions Rm toward a negative side of y direction. Hereinafter y direction may be referred to as a scanning direction of the scan lines (first direction). Moreover, the scan regions Rm are sequentially scanned while the scan lines are moved in a direction (toward a negative side of x direction in case of FIG. 5) orthogonal to the scanning direction of the scan lines, enabling scanning over the scan regions Rm. At this point, control of the deflectors $17\_m$ by the scanning-signal control circuit 51 and control of the position of the object 71 by the stage control circuit 52 are performed in unison so as to emit the primary beams $81\_m$ to desired positions of the object 71.

At completion of the scan in the set irradiation region 73, the subsequent irradiation region 73 is set next to the scanned irradiation region 73 on an opposite side in a moving direction of the sample stage 31 and then is scanned with the primary beams. In FIG. 3, a thick arrow indicates the moving direction of the sample stage 31. At completion of a scan on an end of the observation region 72 in the negative side of x direction, the irradiation region 73 is moved toward the negative side of y direction to repeatedly scan the irradiation region 73 with the primary beams 81. In other words, the deflectors $17\_m$ are controlled by the scanning-signal control circuit 51 and the position of the object 71 is controlled by the stage control circuit 52 such that the primary beams 81 sequentially scan a strip-shaped region 74 (as wide as the irradiation region 73 in y direction and extending longitudinally in x direction). The strip-shaped region 74 is obtained by dividing the observation region 72 in y direction. The multiple strip-shaped regions 74 are scanned so as to scan the overall observation region 72.

In the foregoing comparative example, the scan regions Rm set in the irradiation region 73 are all scanned in the same order. In other words, in the scan regions Rm adjacent to each other in the scanning direction of the scan lines, lines to be scanned at the same time are disposed on the same straight line. At a moment when the surface of the object 71 is irradiated with the primary beam 81, an irradiation point of the surface is caused to carry a strong positive charge by emission of secondary electrons. The emitted secondary electrons are redistributed with passage of time from the irradiation, so that a voltage at or near the irradiation point converges to a gradual distribution. A vicinity of a border of the scan region Rm is affected by charge from the adjacent scan region Rm. For example, a vicinity of a border of the scan region R1 is affected by electric fields from the adjacent scan regions R2 and R4. The shorter the distance between the scan lines emitted at the same time in adjacent regions, the greater the influence of electric fields.

For example, in the scan regions R1, R2, and R4, the first scan line is located on a right end of each region. The first scan line of the scan region R4 is closer to the first scan line of the scan region R1 than the first scan line of the scan region R2. In other words, the vicinity of a border of the scan region Rm is considerably affected by charge from the adjacent scan region Rm in the scanning direction of the scan lines.

Figure 6:
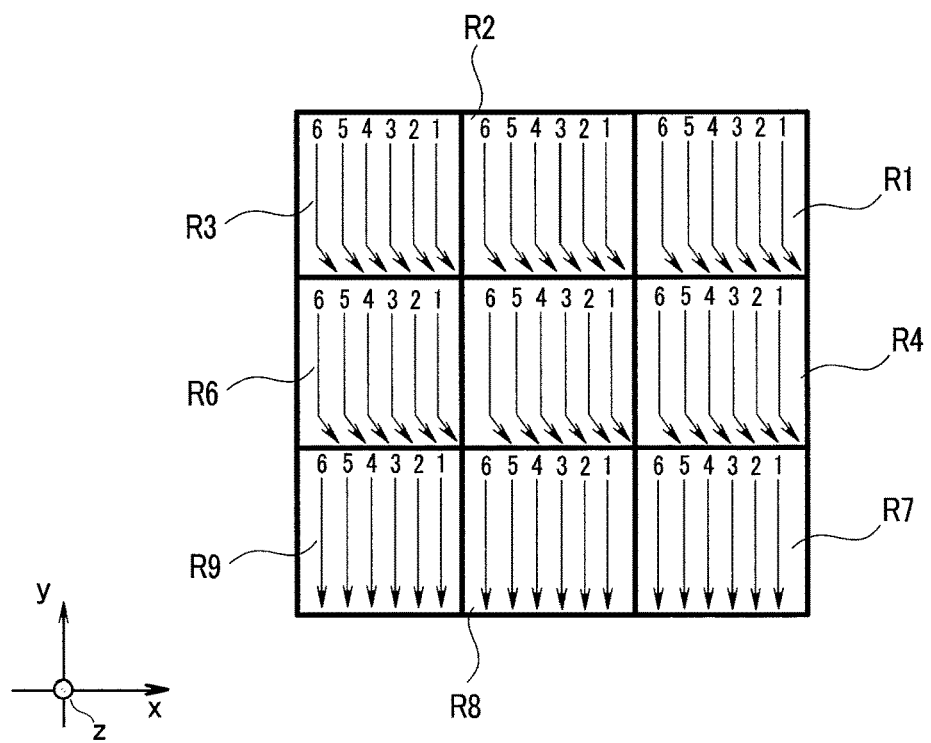
FIG. 6 is an explanatory diagram illustrating an example of distortions of scan lines according to the comparative example.

Referring to FIG. 6, influence of charge will be described below. FIG. 6 is an explanatory diagram illustrating an example of distortions of the scan lines according to the comparative example. The first line in the scan region R1 has an endpoint near a starting point of the first line of the scan region R4. By scanning with the primary beams 81, the regions irradiated with the beams are electrically charged. A short time period (e.g., several μs) is set between irradiation of the starting point of the first scan line in the scan region R4 with the primary beam $81\_4$ and irradiation of the endpoint of the first scan line in the scan region R1 with the primary beam $81\_1$. Thus, for example, a distortion occurs near the endpoint of the first scan line in the scan region R1 as illustrated in FIG. 6 due to influence of charge of the scan region R4.

Figure 7:
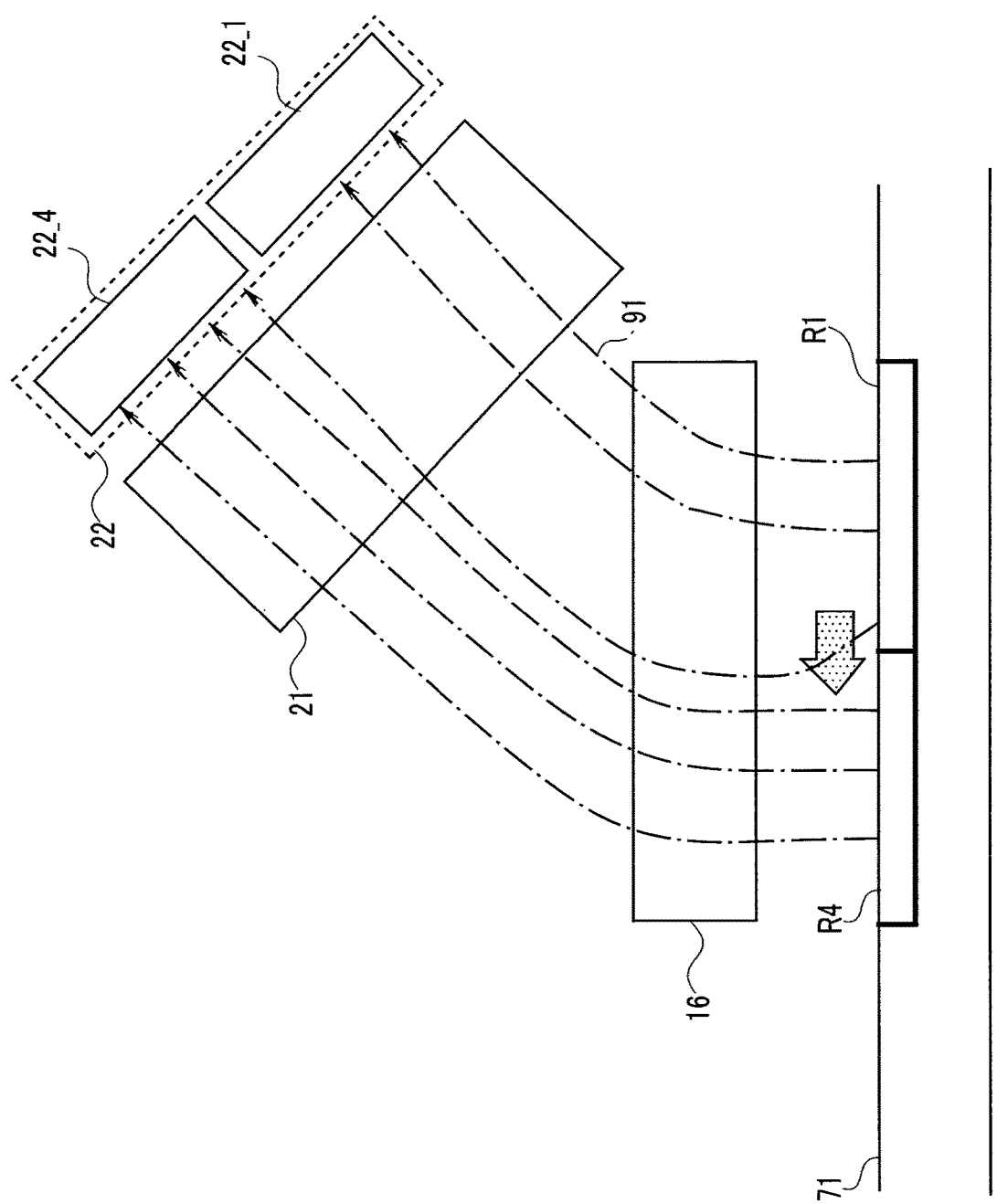
FIG. 7 is an explanatory diagram illustrating an example of erroneous detection of a secondary beam according to the comparative example.

The influence of charge from the adjacent scan region Rm in the scanning direction of the scan lines may cause erroneous detection of the secondary beam as well as a distortion of the scan line. FIG. 7 is an explanatory diagram illustrating an example of erroneous detection of the secondary beam according to the comparative example. Behaviors of secondary electrons emitted from the irradiation point of the primary beams 81 are broadly divided into three: A first behavior is return to the irradiation point (redistributed) by the voltage distribution formed by positive charge of the irradiation point. A second behavior is being drawn into the objective lens 18 and entry into the detection section 22 through the projection optical system 21. A third behavior is being redistributed to a region around the irradiation point. When the region near the irradiation point is irradiated with the primary beam 81, redistribution to the region around the irradiation point is affected by a voltage distribution formed in the region.

When the primary beam $81\_4$ is emitted to a vicinity of an irradiation point of the primary beam $81\_1$ (e.g., at a position of several μm) substantially at the same time (e.g., a difference of several μs), secondary electrons emitted by irradiation of the primary beam $81\_1$ are considerably affected by a voltage distribution formed by the primary beam $81\_4$. In FIG. 7, a shaded thick arrow indicates a force applied to secondary electrons by the voltage distribution (surface charging) formed by the primary beam $81\_4$. For example, as illustrated in FIG. 7, an orbit of secondary electrons (secondary beam 91) emitted from the scan region R1 serving as the irradiation point of the primary beam $81\_1$ is changed to reach the detector $22\_4$ instead of the detector $22\_1$ to receive the secondary electrons. In other words, in the scan region R1, part of the secondary beam $91\_1$ emitted from a vicinity of a border with the scan region R4 is erroneously detected by the detector $22\_4$. Hence, a correct observation image may not be obtained in a region near the scan regions Rm adjacent to each other in the scanning direction of the scan lines.

Figure 8:
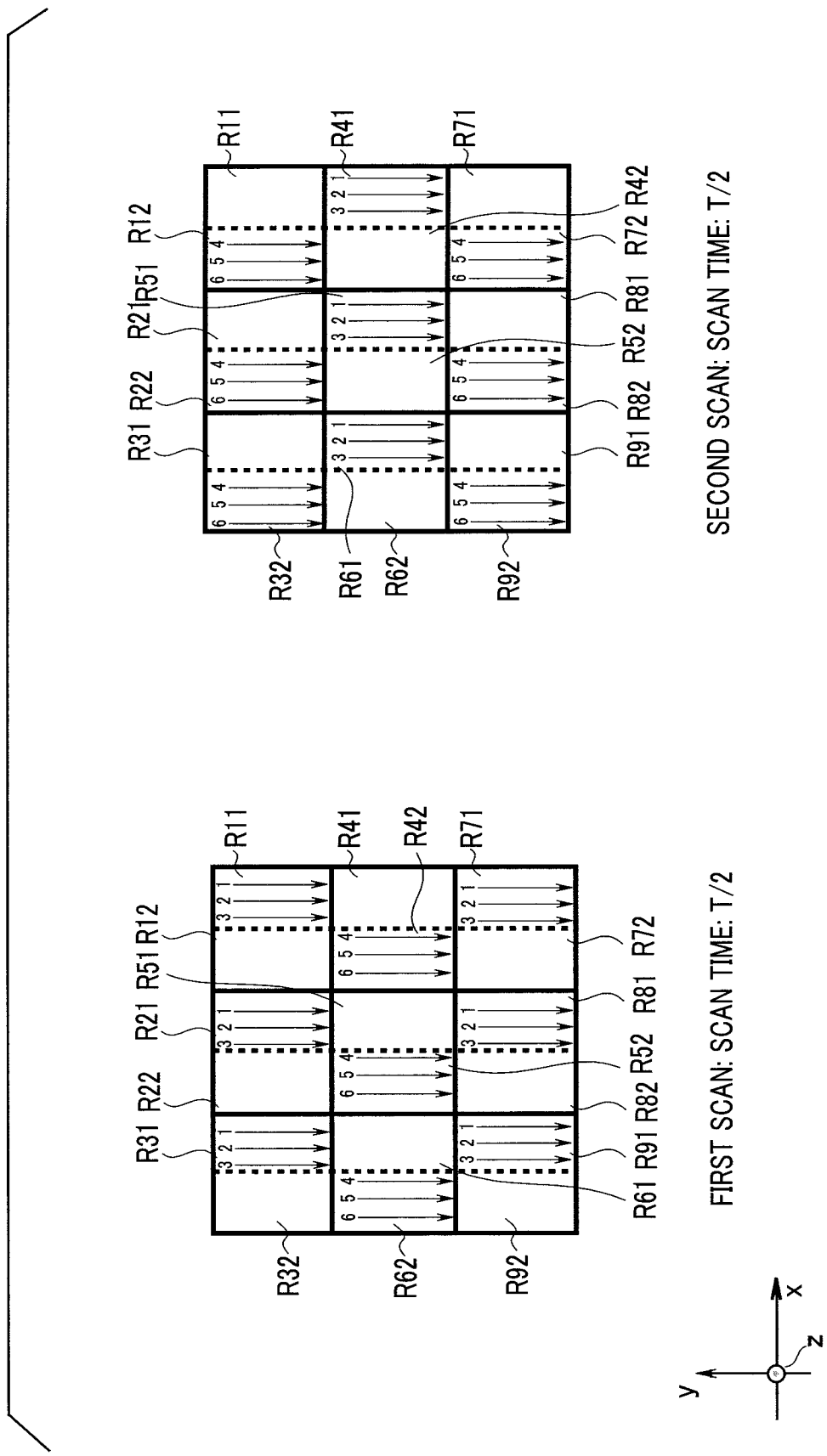
FIG. 8 is an explanatory diagram of a scanning method of the primary beams according to the embodiment.

A scanning method according to the embodiment will be described below. FIG. 8 is an explanatory diagram of a scanning method of the primary beams according to the embodiment. In the present embodiment, each scan region Rm is divided into two in a direction orthogonal to the scanning direction of the scan lines, so that separated scan regions Rmα (α=1, 2) are provided. The scan regions R1n to R9n are scanned by the respective primary beams $81\_1$ to $81\_9$.

The primary beams $81\_m$ sequentially scan two separated scan regions Rm1 and Rm2. At this point, in two scan regions Rm adjacent to each other in the scanning direction of the scan lines, the separated scan regions Rmα0 adjacent to each other in the scanning direction of the scan lines are scanned at different times. For example, a separated scan region R11 of the scan region R1 and a separated scan region R42 of the scan region R4 are scanned at the same time, and a separated scan region R12 and a separated scan region R41 are scanned at the same time. Thus, the separated scan region R11 and the separated scan region R41 that are adjacent to each other in the scanning direction of the scan lines are scanned at different times, and the separated scan region R12 and the separated scan region R42 that are adjacent to each other in the scanning direction of the scan lines are scanned at different times.

In other words, according to the scanning method of the embodiment, each scan region Rm is scanned by two separate scans (a first scan, a second scan). A scan time of the first scan (second scan) in the embodiment is denoted as T/2 where T is a scan time of each scan region Rm in the comparative example. In the first scan, one separated scan region Rm1 (or Rm2) provided in the scan region Rm is scanned. In the second scan, the other separated scan region Rm2 (or Rm1) provided in the scan region Rm is scanned. In the two scan regions Rm adjacent to each other in the scanning direction of the scan lines, the separated scan regions Rmα to be scanned at the same time are set without overlapping each other in the scanning direction of the scan lines.

In an example illustrated in FIG. 8, as to the separated scan regions Rmα provided in the scan regions R1 to R3 and R7 to R9, the separated scan region Rm1 disposed on a positive side of x direction is scanned in the first scan, and the separated scan region Rm2 disposed on a negative side of x direction is scanned in the second scan. As to the separated scan regions Rmα provided in the scan regions R4 to R6, the separated scan region Rm2 disposed on the negative side of x direction is scanned in the first scan, and the separated scan region Rm1 disposed on the positive side of x direction is scanned in the second scan. In other words, the separated scan regions Rmα to be simultaneously scanned in the scan regions Rm adjacent to each other in the scanning direction of the scan lines (first direction) are shifted from each other by Px/2 in x direction (second direction) where Px is a pitch (a width in x direction) of the disposed scan regions Rm. Hence, the influence of charge from the adjacent scan region Rm in the scanning direction of the scan lines is reduced. This can suppress a distortion of the scan line and prevent erroneous detection of the secondary beam, thereby improving quality of an observation image.

The separated scan region Rmα can be moved from the first scan to the second scan by adjusting magnitudes of an electric field and a magnetic field that are applied to the deflectors 17_m and controlling irradiation directions of the primary beams 81_m. For example, in the example illustrated in FIG. 8, the sample stage 31 moves to the positive side of x direction in the scan regions R4 to R6, and the separated scan region Rmα moving from the first scan to the second scan also moves to the positive side of x direction. In this case, the separated scan region Rmα can be moved by adjusting the irradiation directions of the primary beams 81_4 to 81_6 by means of the deflectors 17_4 to 17_6.

Figure 9:
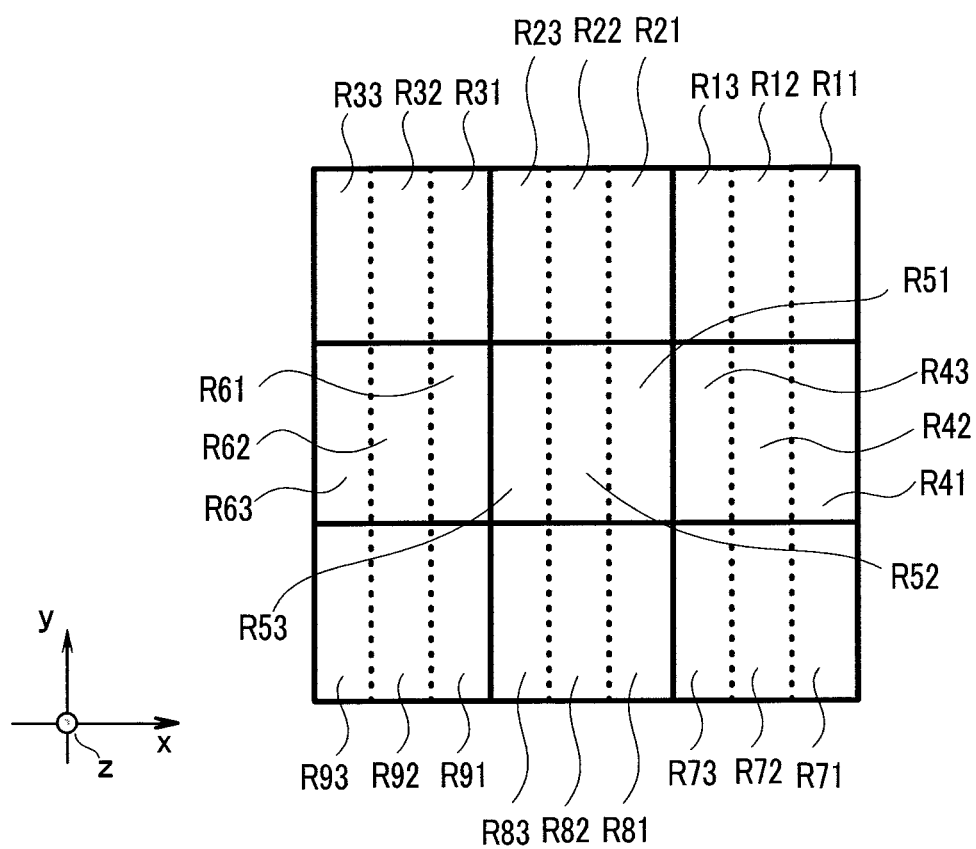
FIG. 9 is an explanatory diagram of separated scan regions when each scan region is divided into three.
Figure 10:
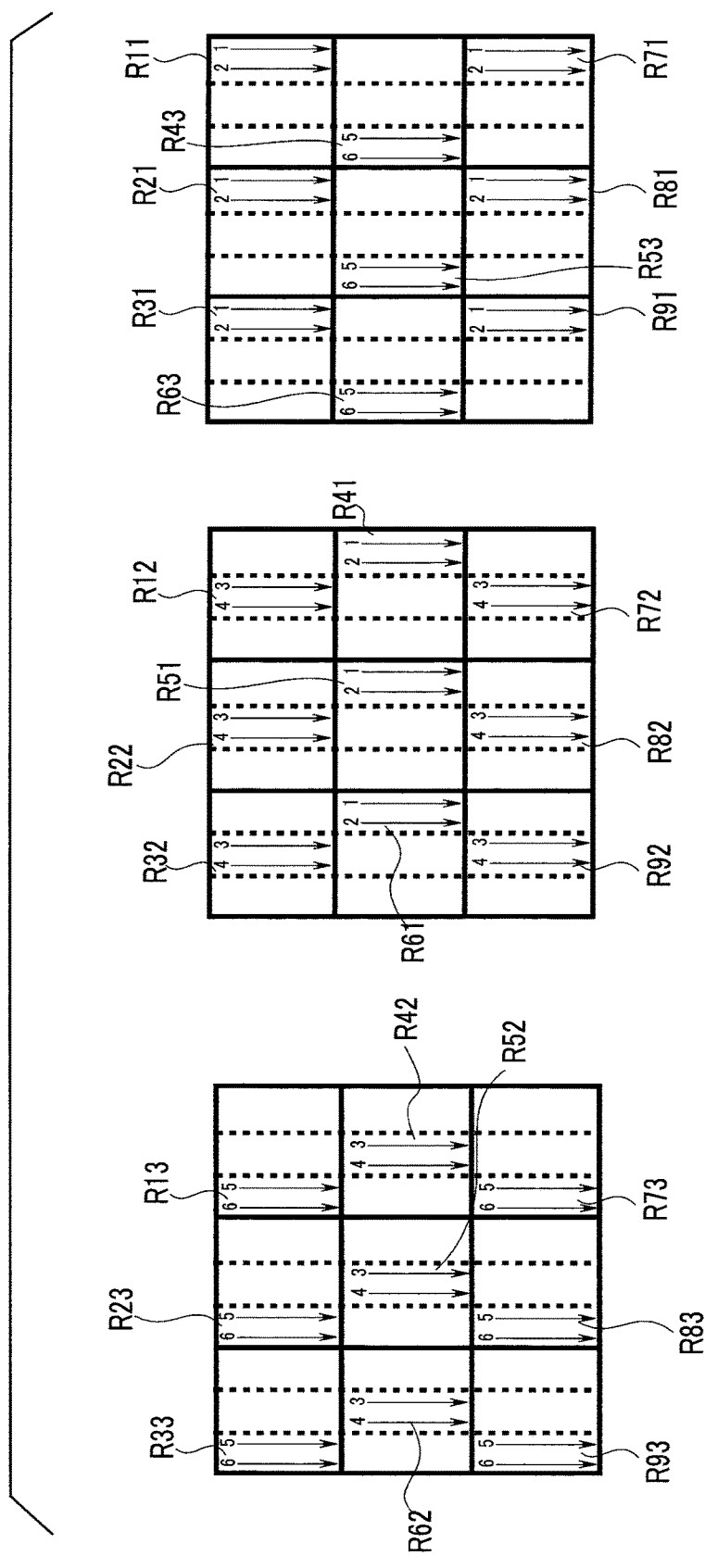
FIG. 10 is an explanatory diagram of a scanning method of the separated scan regions illustrated in FIG. 9.

The number of separated scan regions Rmn formed in each scan region Rm is not limited to two. Three or more separated scan regions Rmn may be formed. FIG. 9 is an explanatory diagram of separated scan regions when each scan region is divided into three. FIG. 10 is an explanatory diagram of a scanning method of the separated scan regions illustrated in FIG. 9. As illustrated in FIG. 9, each scan region Rm is divided into three in the direction orthogonal to the scanning direction of the scan lines, so that separated scan regions Rmβ (β=1 to 3) are provided. Scan regions R1β to R9β are scanned by the respective primary beams 81_1 to 81_9.

When each scan region Rm is divided into three, as illustrated in FIG. 10, each scan region Rm is scanned by three separate scans (a first scan, a second scan, and a third scan). The first to third scans in the embodiment each have a scan time of T/3 where T is the scan time of each scan region Rm in the comparative example. As to the separated scan regions Rmβ provided in the scan regions R1 to R3 and R7 to R9, the separated scan region Rm3 disposed on a most negative side of x direction is scanned in the first scan, the separated scan region Rm2 disposed at a center of x direction is scanned in the second scan, and the separated scan region Rm1 disposed on the most positive side of x direction is scanned in the third scan. As to the separated scan regions Rmβ provided in the scan regions R4 to R6, the separated scan region Rm2 disposed at the center of x direction is scanned in the first scan, the separated scan region Rm1 disposed on the most positive side of x direction is scanned in the second scan, and the separated scan region Rm3 disposed on the most negative side of x direction is scanned in the third scan. In other words, the separated scan regions Rmβ to be simultaneously scanned in the scan regions Rm adjacent to each other in the scanning direction of the scan lines are shifted from each other by Px/3 or Px2/3 in x direction where Px is the pitch (a width in x direction) of the disposed scan regions Rm. Hence, the influence of charge from the adjacent scan region Rm in the scanning direction of the scan lines is reduced. This can suppress a distortion of the scan line and prevent erroneous detection of the secondary beam, thereby improving the quality of an observation image.

Figure 11:
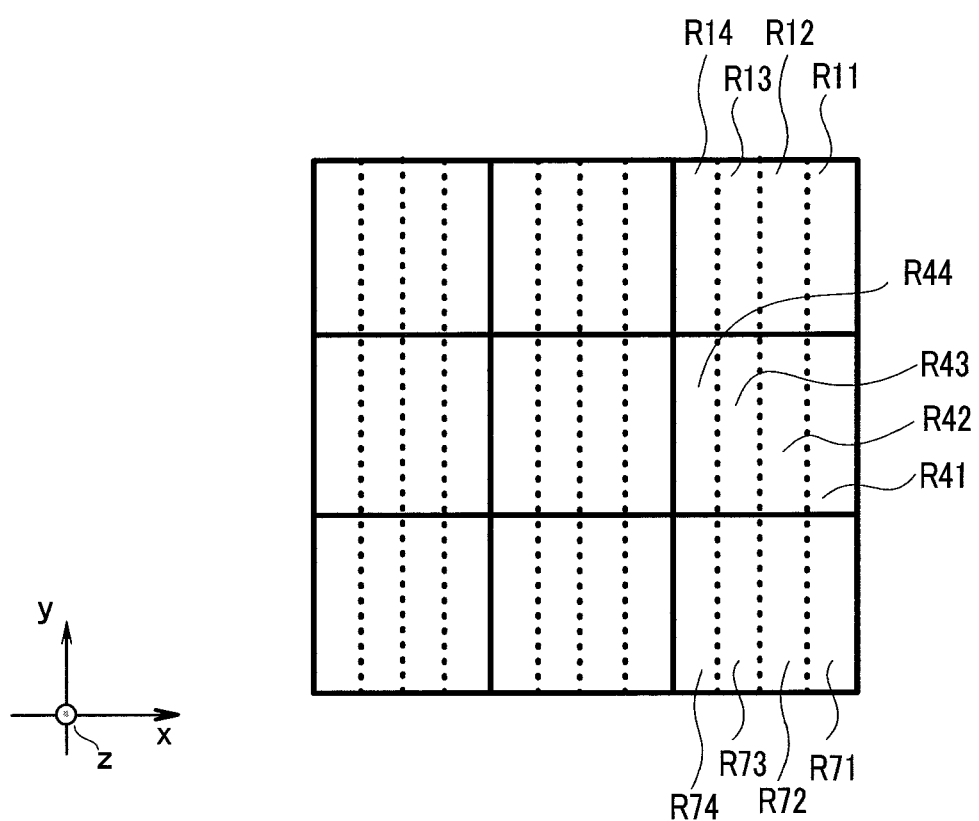
FIG. 11 is an explanatory diagram of separated scan regions when each scan region is divided into four.

FIG. 11 is an explanatory diagram of separated scan regions when each scan region is divided into four. As illustrated in FIG. 11, each scan region Rm is divided into four in the direction orthogonal to the scanning direction of the scan lines, so that separated scan regions Rmγ (γ=1 to 4) are provided. Scan regions R1γ to R9γ are scanned by the respective primary beams 81_1 to 81_9.

When each scan region Rm is divided into four, each scan region Rm is scanned by four separate scans (a first scan, a second scan, a third scan, and a fourth scan). The first to fourth scans in the embodiment each have a scan time of T/4 where T is the scan time of each scan region Rm in the comparative example. As to the separated scan regions Rmγ provided in the scan regions R1 to R3 and R7 to R9, the separated scan region Rm4 disposed on the most negative side of x direction is scanned in the first scan, the separated scan region Rm3 that is a second region from the negative side of x direction is scanned in the second scan, the separated scan region Rm2 that is a second region from the positive side of x direction is scanned in the third scan, and the separated scan region Rm1 disposed on the most positive side of x direction is scanned in the fourth scan.

As to the separated scan regions Rmγ provided in the scan regions R4 to R6, the separated scan region Rm2 that is a second region from the positive side of x direction is scanned in the first scan, the separated scan region Rm1 disposed on the most positive side of x direction is scanned in the second scan, the separated scan region Rm4 disposed on the most negative side of x direction is scanned in the third scan, and the separated scan region Rm3 that is a second region from the negative side of x direction is scanned in the fourth scan. In other words, the separated scan regions Rmγ to be simultaneously scanned in the scan regions Rm adjacent to each other in the scanning direction of the scan lines are shifted from each other by Px/2 in x direction where Px is the pitch (a width in x direction) of the disposed scan regions Rm. Moreover, the separated scan regions Rmγ to be simultaneously scanned in the scan regions Rm adjacent to each other in the scanning direction of the scan lines are set at intervals of Px/4 in x direction without forming any contacts. Hence, the influence of charge from the adjacent scan region Rm in the scanning direction of the scan lines is reduced. This can suppress a distortion of the scan line and prevent erroneous detection of the secondary beam, thereby improving the quality of an observation image.

FIGS. 12 to 15 are explanatory diagrams of another scanning method when each scan region is divided into three. In the foregoing scanning method, the separated scan regions included in one scan region are scanned by the same primary beam. In contrast, in the scanning method described below, the separated scan regions included in one scan region are scanned by different primary beams.

Figure 12:
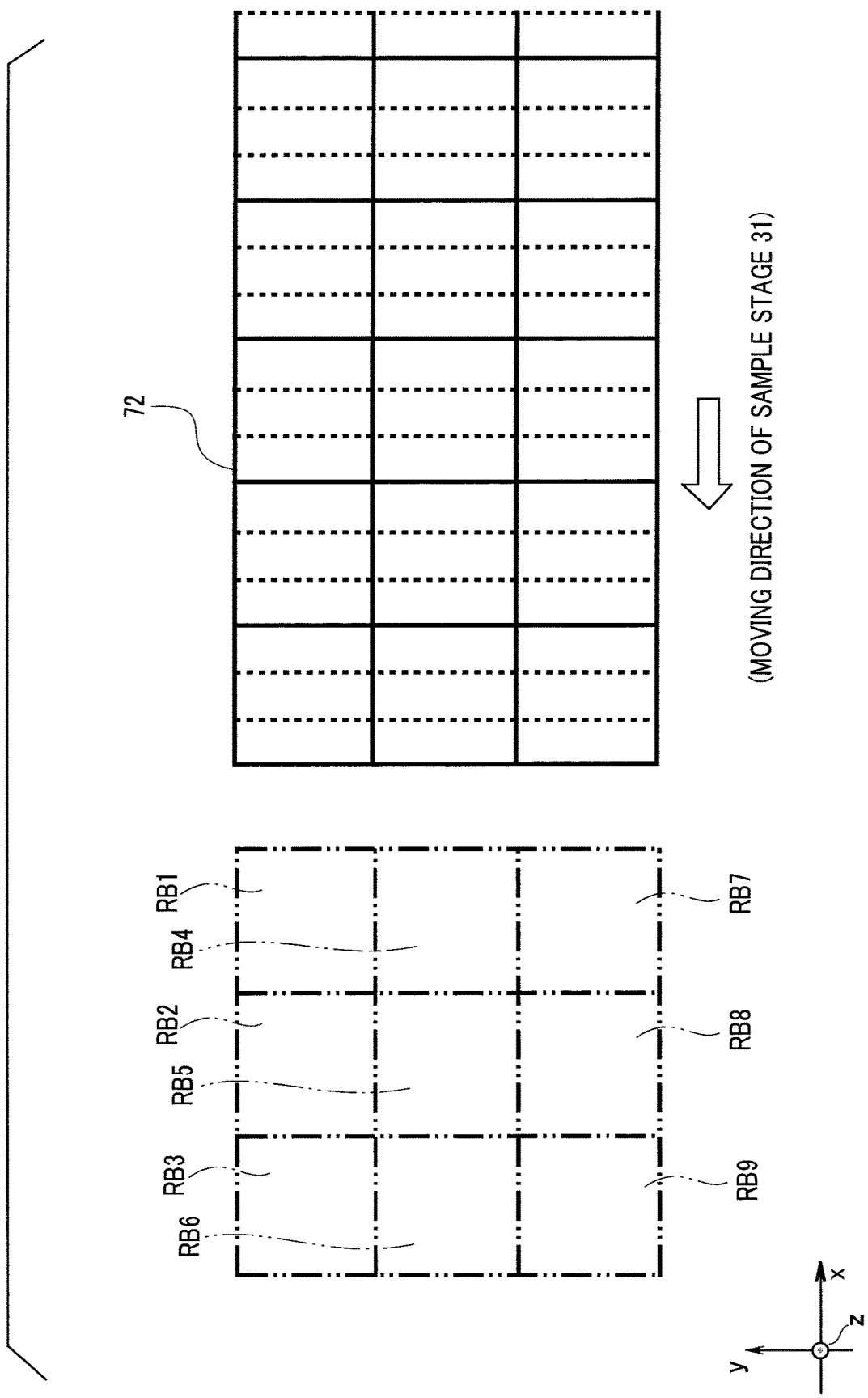
FIG. 12 is an explanatory diagram of another scanning method when each scan region is divided into three.

First, as illustrated in FIG. 12, the object 71 is initialized such that the primary beam 81 scans the observation region 72 from an upper-left portion to a lower-right portion. In other words, the sample stage 31 is moved toward the negative side of x direction. In FIG. 12, rectangular regions RB1 to RB9 indicated by chain double-dashed lines can be irradiated with the primary beams 81_1 to 81_9. When the sample stage 31 is moved to superimpose the observation region 72 on the regions RB1 to RB9, the observation region 72 can be scanned by the primary beams 81_1 to 81_9.

Figure 13:
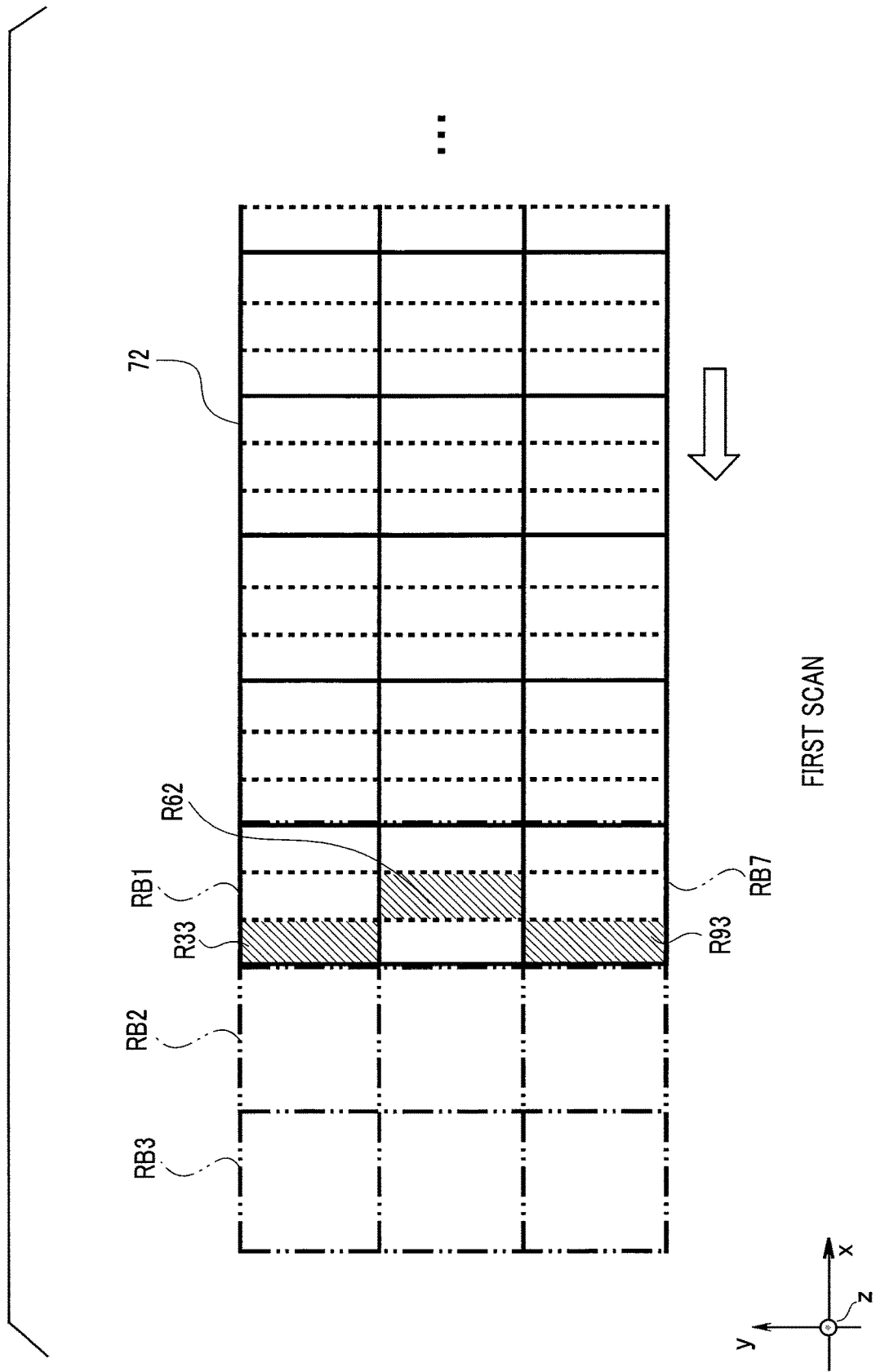
FIG. 13 is an explanatory diagram of another scanning method when each scan region is divided into three.
Figure 14:
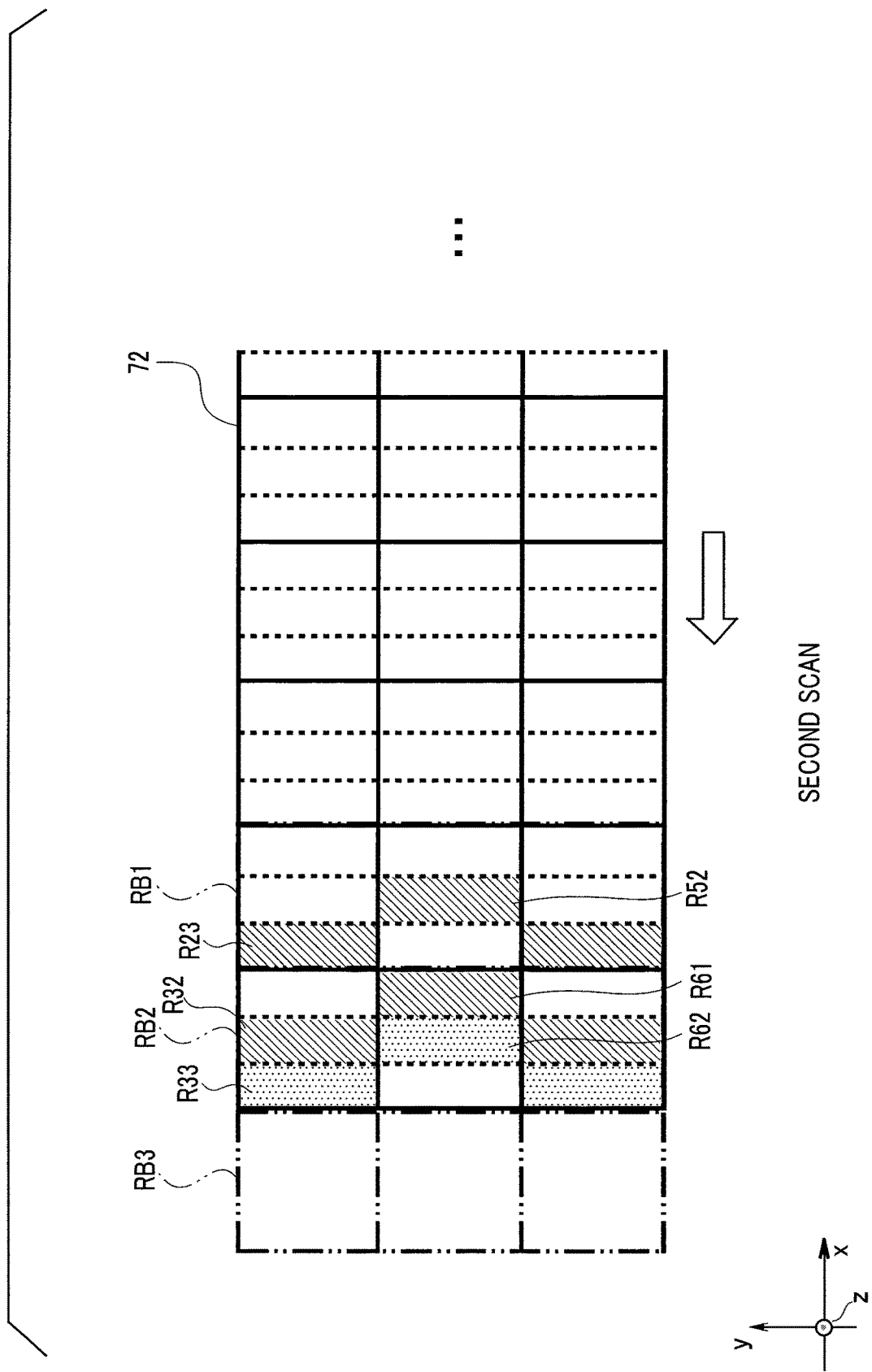
FIG. 14 is an explanatory diagram of another scanning method when each scan region is divided into three.

When the sample stage 31 is moved such that the scan regions (corresponding to the scan regions R3, R6, and R9 in FIG. 9) on a left end of the observation region 72 overlap the regions RB1, RB4, and RB7, the first scan is started. As illustrated in FIG. 13, in the first scan, a separated scan region R33 of the scan region R3 is scanned by the primary beam 81_1, a separated scan region R62 of the scan region R6 is scanned by the primary beam 81_4, and a separated scan region R93 of the scan region R9 is scanned by the primary beam 81_7. In FIGS. 13 to 15, the separated scan regions to be scanned are hatched. In FIGS. 14 and 15, the separated scan regions having been scanned are shaded.

At the completion of the first scan, the sample stage 31 is moved such that second scan regions from left of the observation region 72 (regions corresponding to the scan regions R2, R5, and R8 of FIG. 9) are set to overlap the regions RB1, RB4, and RB7 as illustrated in FIG. 14. When the setting is completed, the second scan is started. As illustrated in FIG. 14, in the second scan, a separated scan region R23 of the scan region R2 is scanned by the primary beam 81_1, a separated scan region R52 of the scan region R5 is scanned by the primary beam 81_4, and a separated scan region R83 of the scan region R8 is scanned by the primary beam 81_7. Moreover, a separated scan region R32 of the scan region R3 is scanned by the primary beam 81_2, a separated scan region R61 of the scan region R6 is scanned by the primary beam 81_5, and a separated scan region R92 of the scan region R9 is scanned by the primary beam 81_8.

At the completion of the second scan, the sample stage 31 is moved again such that third scan regions from the left of the observation region 72 (regions corresponding to the scan regions R1, R4, and R7 of FIG. 9) are set to overlap the regions RB1, RB4, and RB7 as illustrated in FIG. 15. When the setting is completed, the third scan is started. As illustrated in FIG. 15, in the third scan, a separated scan region R13 of the scan region R1 is scanned by the primary beam 81_1, a separated scan region R42 of the scan region R4 is scanned by the primary beam 81_4, and a separated scan region R73 of the scan region R7 is scanned by the primary beam 81_7. Moreover, a separated scan region R22 of the scan region R2 is scanned by the primary beam 81_2, a separated scan region R51 of the scan region R5 is scanned by the primary beam 81_5, and a separated scan region R82 of the scan region R8 is scanned by the primary beam 81_8. Furthermore, a separated scan region R31 of the scan region R3 is scanned by the primary beam 81_3, a separated scan region R63 of the scan region R6 is scanned by the primary beam 81_6, and a separated scan region R91 of the scan region R9 is scanned by the primary beam 81_9.

As described above, the primary beams 81_1, 81_6, and 81_7 scan the separated scan regions disposed on the most negative side of x direction, the primary beams 81_2, 81_4, and 81_8 scan the separated scan regions disposed at the center of x direction, and the primary beams 81_3, 81_5, and 81_9 scan the separated scan regions disposed on the most positive side of x direction regardless of the scanning steps. In other words, the positions of the separated scan regions are fixed in the scan regions R to be irradiated with the primary beams 81_m, and a scan is performed in three steps by the different primary beams, thereby completing a scan in each scan region R. For example, in the first scan, the separated scan region R33 of the scan region R3 is scanned by the primary beam 81_1. In the subsequent second scan, the separated scan region R32 is scanned by the primary beam 81_2. In the last third scan, the separated scan region R31 is scanned by the primary beam 81_3, completing scanning over the scan regions R3.

Such a scan reduces the influence of charge from the adjacent scan region R in the scanning direction of the scan lines. This can suppress a distortion of the scan line and prevent erroneous detection of the secondary beam. From the first scan to the third scan, a beam scan of the deflector 17 can also be synchronized with the sample stage 31 while the sample stage 31 is continuously moved without being stopped. This enables a beam scan on the observation region 72 without stopping the sample stage 31 for each beam scan, thereby improving a throughput by saving a time of stopping the stage.

The multibeam scanning apparatus generates the plurality of primary beams 81_m by dividing the primary beam 81, which is emitted from the single electron gun, through the aperture array 14. The primary beams 81_m may be generated by using a plurality of electron guns (irradiation sources).

While certain embodiments have been described, these embodiments have been presented by way of example only, and are not intended to limit the scope of the inventions. Indeed, the novel devices and systems described herein may be embodied in a variety of other forms; furthermore, various omissions, substitutions and changes in the form of the devices and systems described herein may be made without departing from the spirit of the inventions. The accompanying claims and their equivalents are intended to cover such forms or modifications as would fall within the scope and spirit of the inventions.

What is claimed is:

1. A multibeam scanning apparatus configured to emit a plurality of electron beams to a plurality of scan regions set in a matrix on an object and obtain an observation image by detecting secondary beams generated from the scan regions, the apparatus comprising:
   a control unit configured to separately control irradiation positions of the plurality of electron beams,
   wherein each of the scan regions includes a plurality of separated scan regions obtained by separating the each of the scan regions in a second direction orthogonal to a first direction serving as a scanning direction of the electron beams, the control unit controls the irradiation positions of the electron beams, in two of the scan regions adjacent to each other in the first direction, such that the separated scan regions to be scanned at a same time are displaced from each other by a predetermined distance in the second direction, and each of the scan regions includes four or more separated scan regions, and the separated scan regions to be scanned at the same time are not in contact with each other in the two scan regions adjacent to each other in the first direction and the two scan regions adjacent to each other in the second direction.

2. The multibeam scanning apparatus according to claim 1, wherein the plurality of separated scan regions constituting each of the scan regions are scanned by different electron beams of the electron beams.

3. The multibeam scanning apparatus according to claim 2, wherein the plurality of electron beams are disposed in a matrix in the first direction and the second direction.

4. The multibeam scanning apparatus according to claim 1, wherein a number of separated scan regions provided in each of the scan regions is equal to a number of electron beams arranged in the second direction.

5. The multibeam scanning apparatus according to claim 4, wherein the electron beams are emitted to the respective separated scan regions at predetermined positions in the scan regions.

6. The multibeam scanning apparatus according to claim 5, further comprising a stage unit on which the object is loaded, wherein the control unit controls the stage unit such that the irradiation positions of the plurality of electron beams to the object move in one direction of the second direction.

7. A multibeam scanning apparatus comprising:

an irradiation unit configured to simultaneously emit a plurality of electron beams, the irradiation unit emitting the electron beams to respective scan regions set in a matrix on an object; and a control unit configured to separately control irradiation positions of the plurality of electron beams, wherein each of the scan regions includes a plurality of separated scan regions obtained by separating the each of the scan regions in a second direction orthogonal to a first direction serving as a scanning direction of the electron beams, the control unit controls the irradiation positions of the electron beams, in two of the scan regions adjacent to each other in the first direction, such that the separated scan regions to be scanned at a same time are displaced from each other by a predetermined distance in the second direction, and each of the scan regions includes four or more separated scan regions, and the separated scan regions to be scanned at the same time are not in contact with each other in the two scan regions adjacent to each other in the first direction and the two scan regions adjacent to each other in the second direction.

8. The multibeam scanning apparatus according to claim 7, wherein the plurality of separated scan regions constituting each of the scan regions are scanned by different electron beams of the electron beams.

9. The multibeam scanning apparatus according to claim 7, wherein a number of separated scan regions provided in each of the scan regions is equal to a number of electron beams arranged in the second direction.

10. The multibeam scanning apparatus according to claim 9, wherein the electron beams are emitted to the respective separated scan regions at predetermined positions in the scan regions.

11. The multibeam scanning apparatus according to claim 10, further comprising a stage unit on which the object is loaded, wherein the control unit controls the stage unit such that the irradiation positions of the plurality of electron beams to the object move in one direction of the second direction.

12. A multibeam scanning method comprising:

emitting a plurality of electron beams to a plurality of scan regions set in a matrix on an object; and obtaining an observation image by detecting secondary beams generated from the scan regions, wherein each of the scan regions includes a plurality of separated scan regions obtained by separating the each of the scan regions in a second direction orthogonal to a first direction serving as a scanning direction of the electron beams, the method further comprises controlling irradiation positions of the electron beams, in two of the scan regions adjacent to each other in the first direction, such that the separated scan regions to be scanned at a same time are displaced from each other by a predetermined distance in the second direction, and each of the scan regions includes four or more separated scan regions, and the irradiation positions of the electron beams are controlled such that the separated scan regions to be scanned at the same time are not in contact with each other in the two scan regions adjacent to each other in the first direction and the two scan regions adjacent to each other in the second direction.

13. The multibeam scanning method according to claim 12, wherein a number of separated scan regions provided in each of the scan regions is equal to a number of electron beams arranged in the second direction, and the plurality of separated scan regions constituting each of the scan regions are scanned by using the respective electron beams arranged in the second direction.

14. The multibeam scanning method according to claim 12, further comprising moving the irradiation positions of the plurality of electron beams to the object in one direction of the second direction.

* * * * *